US007079957B2

(12) United States Patent
Finnigan et al.

(10) Patent No.: US 7,079,957 B2
(45) Date of Patent: Jul. 18, 2006

(54) METHOD AND SYSTEM FOR ACTIVE TIP CLEARANCE CONTROL IN TURBINES

(75) Inventors: Peter Michael Finnigan, Clifton Park, NY (US); Mullahalli Venkataramaniah Srinivas, Guilderland, NY (US); Robert Joseph Albers, Park Hills, KY (US); Guy Wayne DeLeonardo, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/748,812

(22) Filed: Dec. 30, 2003

(65) Prior Publication Data

US 2005/0149274 A1 Jul. 7, 2005

(51) Int. Cl.
*G01R 3/00* (2006.01)
*F01D 11/08* (2006.01)
*F01D 11/12* (2006.01)

(52) U.S. Cl. ........................ 702/33; 60/782; 415/173.2

(58) Field of Classification Search .................. 702/36, 702/83, 130, 136, 145, 158, 179, 182, 184, 702/185; 415/1, 115, 127, 131, 173.2; 73/861.77; 60/782

See application file for complete search history.

(56) References Cited

U.S. PATENT DOCUMENTS

| | | | | |
|---|---|---|---|---|
| 3,227,418 | A * | 1/1966 | West | 415/127 |
| 4,999,991 | A * | 3/1991 | Haddad et al. | 60/782 |
| 5,049,033 | A * | 9/1991 | Corsmeier et al. | 415/173.2 |
| 5,219,268 | A | 6/1993 | Johnson | 415/115 |
| 5,545,007 | A * | 8/1996 | Martin | 415/173.2 |
| 6,626,635 | B1 * | 9/2003 | Prowse et al. | 415/1 |

* cited by examiner

*Primary Examiner*—John Barlow
*Assistant Examiner*—John Le
(74) *Attorney, Agent, or Firm*—Fletcher Yoder

(57) ABSTRACT

A system for controlling blade tip clearance in a turbine. The system includes a stator including a shroud having a plurality of shroud segments and a rotor including a blade rotatable within the shroud. An actuator assembly is positioned radially around the shroud and includes a plurality of actuators. A sensor senses a turbine parameter and generates a sensor signal representative of the turbine parameter. A modeling module generates a tip clearance prediction in response to turbine cycle parameters. A controller receives the sensor signal and the tip clearance prediction and generates at least one command signal. The actuators include at least one actuator receiving the command signal and adjusts a position of at least one of the shroud segments in response to the command signal.

16 Claims, 3 Drawing Sheets

METHOD AND SYSTEM FOR ACTIVE TIP CLEARANCE CONTROL IN TURBINES

BACKGROUND OF THE INVENTION

The invention relates generally to tip clearance control and in particular to active tip clearance control in turbines.

The ability to control blade tip clearances aids in maintaining turbine efficiency and specific fuel consumption, as well as improving blade life and increasing turbine time-in-service. While well suited for their intended purposes, the existing tip clearance control techniques may be enhanced to provide improved tip clearance control.

BRIEF DESCRIPTION OF THE INVENTION

An embodiment is a system for controlling blade tip clearance in a turbine. The system includes a stator including a shroud having a plurality of shroud segments and a rotor including a blade rotatable within the shroud. An actuator assembly is positioned radially around the shroud and includes a plurality of actuators. A sensor senses a turbine parameter and generates a sensor signal representative of the turbine parameter. A modeling module generates a tip clearance prediction in response to turbine cycle parameters. A controller receives the sensor signal and the tip clearance prediction and generates at least one command signal. The actuators include at least one actuator receiving the command signal and adjusts a position of at least one of the shroud segments in response to the command signal.

Another embodiment is a method for controlling blade tip clearance in a turbine having a blade rotating within a shroud having a plurality of shroud segments. The method includes obtaining a turbine parameter and generating a tip clearance prediction in response to turbine cycle parameters. At least one command signal is generated in response to the turbine parameter and the tip clearance prediction. The command signal is provided to an actuator to adjust a position of at least one of the shroud segments.

BRIEF DESCRIPTION OF THE DRAWINGS

Referring to the exemplary drawings wherein like elements are numbered alike in the several Figures.

DETAILED DESCRIPTION OF THE INVENTION

Figure 1:
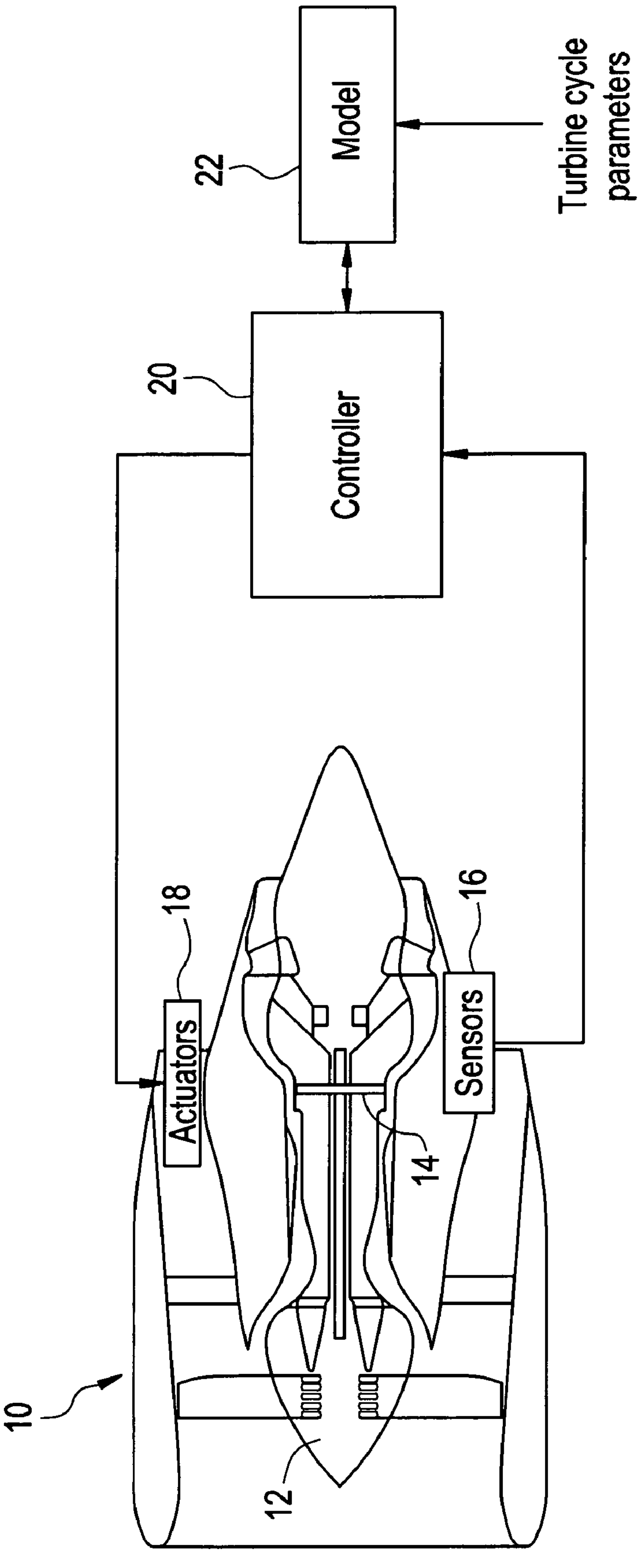
FIG. 1 depicts an exemplary system for active control of tip clearance in an embodiment of the invention.

FIG. 1 depicts an exemplary system for active control of tip clearance in an embodiment of the invention. FIG. 1 depicts a gas turbine 10 in the form of a jet engine. It is understood that embodiments of the invention may be utilized with a variety of turbines (e.g., power generation turbines) and is not limited to jet engine turbines. The turbine 10 includes a rotor 12 having a blade 14 located in a high pressure turbine (HPT) section of the turbine. Blade 14 rotates within the shroud and the spacing between the tip of blade 14 and the shroud is controlled. The shroud is segmented as described in further detail with reference to FIG. 2.

One or more sensors 16 monitor parameters such as temperature, pressure, etc. associated with the HPT or any other section of the turbine 10. The sensors generate sensor signals that are provided to a controller 20. Controller 20 may be implemented using known microprocessors executing computer code or other devices such as application specific integrated circuits (ASICs). The sensor signals allow the controller 20 to adjust tip clearance in response to short-term takeoff-cruise-landing conditions, as well as long term deterioration.

The sensors 16 may be implemented using a variety of sensor technologies including capacitive, inductive, ultrasonic, optical, etc. The sensors 16 may be positioned relative to the HPT section of the turbine so that the sensors are not exposed to intense environmental conditions (e.g., temperatures, pressures). In this scenario, the controller 20 may derive actual turbine parameters based on the sensor signals through techniques such as interpolation, extrapolation, etc. This leads to increased sensor life.

Controller 20 is coupled to a modeling module 22 that receives turbine cycle parameters (e.g., hours of operation, speed, etc.) and outputs a tip clearance prediction to the controller 20. The modeling module 22 may be implemented by the controller 20 as a software routine or may be separate device executing a computer program for modeling the turbine operation. The modeling module 22 generates the tip clearance prediction in real-time and provides the prediction to controller 20.

The modeling module 22 uses high fidelity, highly accurate, clearance prediction algorithms based on 3D parametric, physics-based transient engine models. These models are integrated with simpler, computationally efficient, response surfaces that provide real time tip clearance prediction usable in an active control system. These models incorporate the geometric and physics-based mission information to accurately calculate tip clearances, accounting for variability in the turbine geometry and turbine cycle parameters. The models may be updated in real-time by adjusting the mathematical models based sensor information in conjunction with Baysian techniques or a Kalman filter to account for environment changes, as well as long-term engine degradation (e.g., blade tip erosion).

Controller 20 sends a command signal to one or more actuators 18 to adjust the shroud and control tip clearance. As described in further detail herein, the actuators 18 are arranged radially around the inner casing of the turbine stator and apply force to adjust the shroud position. The position of one or more shroud segments may be adjusted to control shroud-rotor concentricity and/or shroud-rotor non-circularity.

Figure 2:
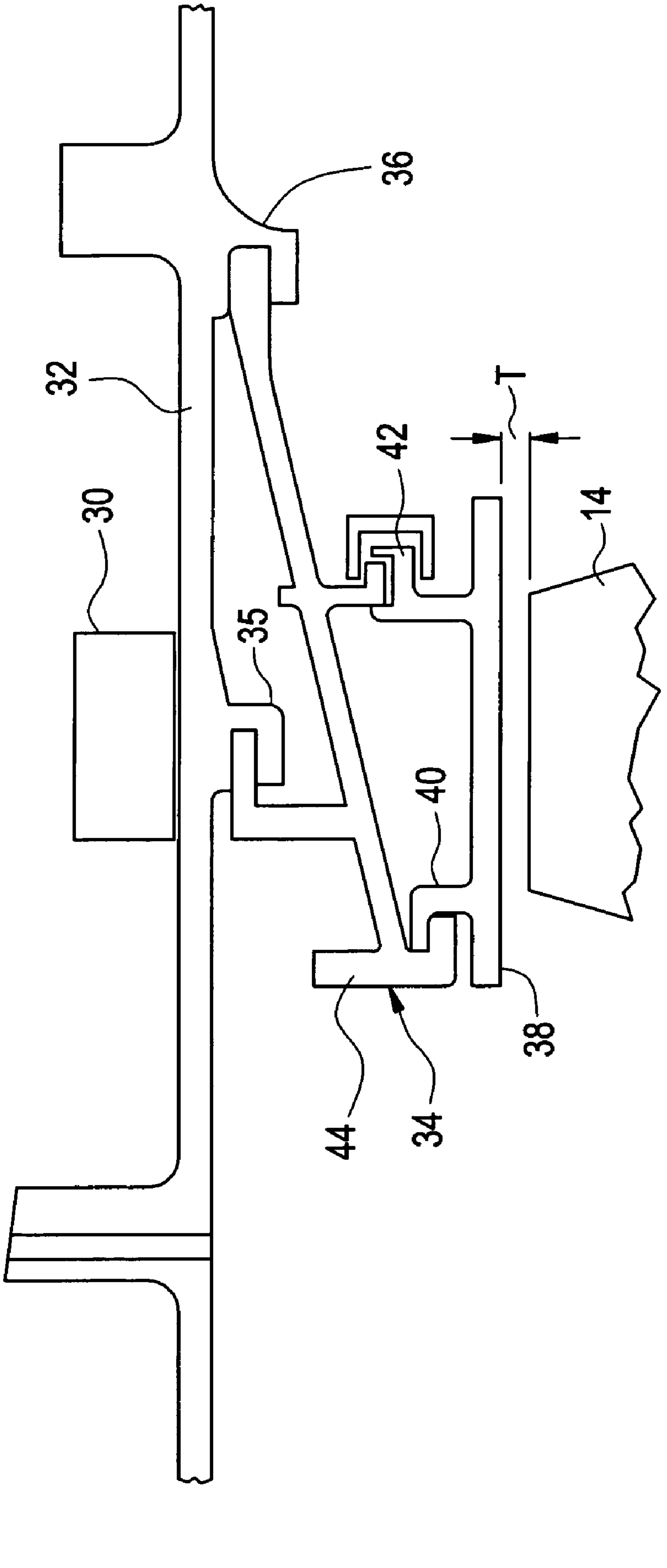
FIG. 2 depicts a portion of a turbine stator in an embodiment of the invention.

FIG. 2 depicts an exemplary turbine stator in an embodiment of the invention. An actuator assembly 30 is positioned radially disposed around an annular inner casing 32. A stator assembly generally shown at 34 is attached to inner casing 32 by forward and aft case hooks 35 and 36 respectively. Stator assembly 34 includes an annular stator shroud 38, divided into a plurality of shroud segments, mounted by shroud hooks 40 and 42 to a segmented shroud support 44. Shroud 38 circumscribes turbine blades 14 of rotor 12 and is used to prevent the flow from leaking around the radial outer tip of blade 14 by minimizing the radial blade tip clearance T. Force is applied by the actuator assembly 30 to the inner casing 32 to position the shroud 38.

Figure 3:
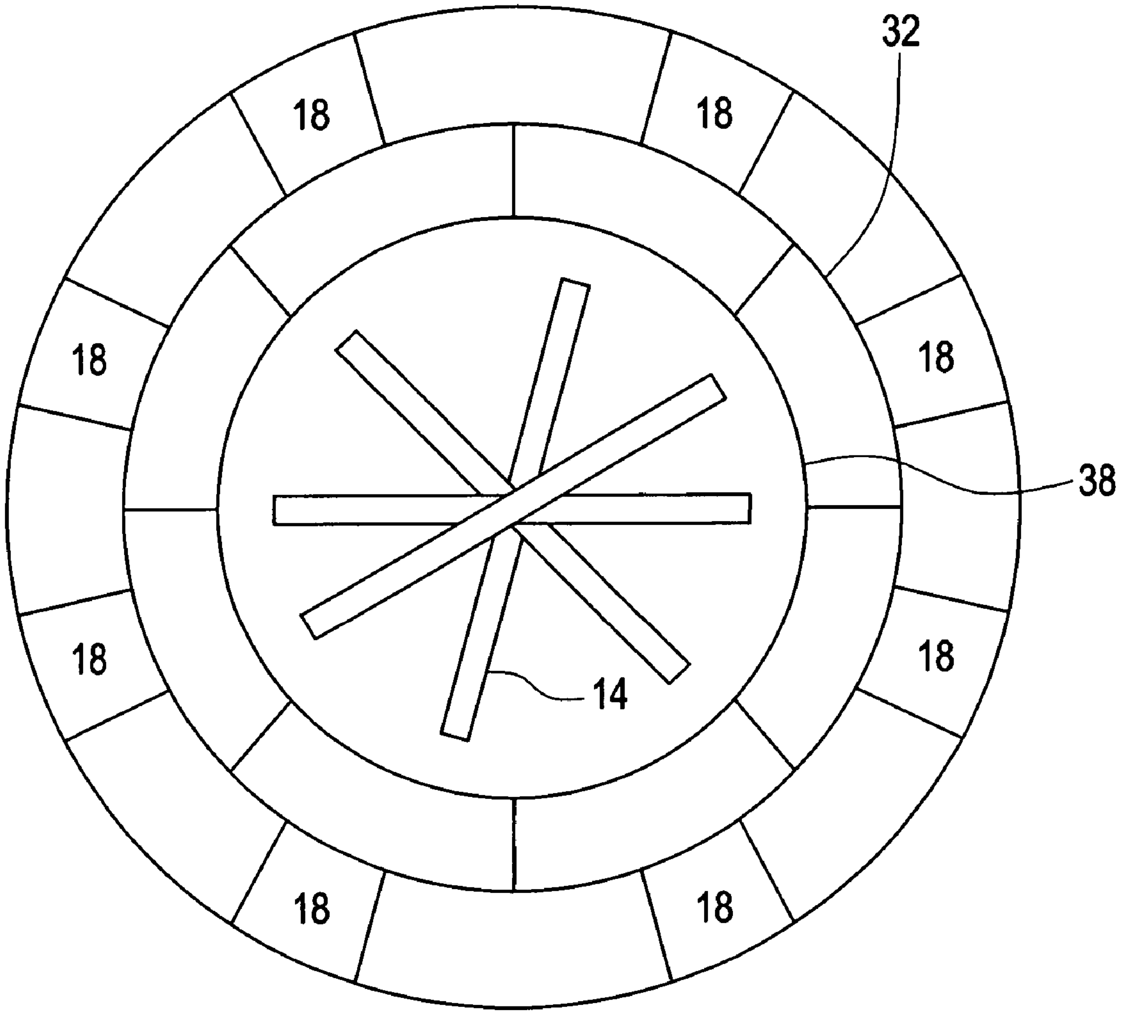
FIG. 3 depicts and exemplary actuator assembly in an embodiment of the invention.

FIG. 3 depicts the stator including segmented shroud 38, inner casing 32 and actuator assembly 30 surrounding the periphery of the inner casing 32. The mechanical interconnection between the inner casing 32 and the shroud segment 38 is not shown for clarity. Each actuator 18 may receive a command signal from controller 20 to increase or decrease pressure on one or more segments of shroud 38 to adjust the position of shroud 38 relative to the tips of blade 14. The actuators 18 may have a variety of configurations. In one embodiment, each actuator 18 includes a circumferential screw coupled to a drive mechanism (hydraulic, pneumatic, etc.). In response to a command signal from controller 20, the drive mechanism rotates the circumferential screw clockwise or counter-clockwise. The actuator assembly 30 contracts or expands, either globally (i.e., at all actuators) or locally (i.e., at less than all actuators), to adjust the position of shroud 38 relative to the tips of blade 14.

In an alternate embodiment, the actuators 18 are inflatable bellows that apply radial force on shroud inner casing 32 to adjust the position of shroud 38. Each actuator includes a pump coupled to an inflatable bellows and the pressure is either increased or decreased in the bellows in response to a control signal. Again, each actuator may operate independently in response to independent control signals to provide segmented control of the position of each segment of shroud 38.

In an alternate embodiment, the actuators 18 are radially, rather than circumferentially, mounted screws. In one embodiment, each actuator 18 includes a radial screw coupled to a drive mechanism (hydraulic, pneumatic, etc.). In response to a command signal from controller 20, the drive mechanism rotates the circumferential screw clockwise or counter-clockwise. The actuator 18 increases or decreases radial force on inner casing 32 to adjust the position of shroud 38. Again, each actuator may operate independently in response to independent control signals to provide segmented control of the position of each segment of shroud 38.

The active tip clearance control may be used in combination with existing passive tip clearance control techniques. Exemplary passive tip clearance control techniques use thermal techniques to expand or contract the shroud to control tip clearance. The combination of passive (slow-acting) and active (fast-acting) tip clearance control maintains tight clearances during a wide range of turbine operation. In this embodiment, the modeling module 22 includes modeling of the passive tip clearance control.

Embodiments of the invention provide increased turbine efficiency and reduced exhaust temperature (EGT), leading to longer inspection intervals. Embodiments of the invention provide an integrated solution that enables high performance turbines to operate without threat of blade tips rubbing the shroud with tighter clearances than is possible with current slow-acting passive systems.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A system for controlling blade tip clearance in a turbine, the system comprising:

a stator including a shroud having a plurality of shroud segments;

a rotor including a blade rotatable within said shroud;

an actuator assembly positioned radially around said shroud, said actuator assembly including a plurality of actuators;

a sensor for sensing a turbine parameter and generating a sensor signal representative of said turbine parameter;

a modeling module generating a tip clearance prediction in response to turbine cycle parameters;

a controller receiving said sensor signal and said tip clearance prediction and generating at least one command signal;

said actuators including at least one actuator receiving said command signal and adjusting a position of at least one of said shroud segments in response to said command signal.

2. The system of claim 1 wherein:

said at least one command signal includes a plurality of command signals; each of said plurality of actuators receiving a respective command signal to adjust a position of a respective one of said shroud segments.

3. The system of claim 1 wherein:

said stator includes an inner casing mechanically coupled to said shroud, said actuator assembly positioned radially around said inner casing.

4. The system of claim 1 wherein:

said controller derives an actual turbine parameter in response to said sensor signal;

said controller generating said at least one command signal in response to said actual turbine parameter.

5. The system of claim 1 wherein:

said modeling module generates said tip clearance prediction in real-time.

6. The system of claim 1 wherein:

said modeling module updates a model used for generating said tip clearance prediction in response to environmental changes.

7. The system of claim 1 wherein:

said modeling module updates a model used for generating said tip clearance prediction in response to engine degradation.

8. The system of claim 1 wherein:

said actuator includes a circumferential screw coupled to a drive mechanism, said command signal being applied to said drive mechanism to control rotation of said circumferential screw.

9. The system of claim 1 wherein:

said actuator includes a radial screw coupled to a drive mechanism, said command signal being applied to said drive mechanism to control rotation of said radial screw.

10. The system of claim 1 further comprising:

a passive tip clearance control apparatus operating in conjunction with actuators to position at least one of said shroud segments.

11. A method for controlling blade tip clearance in a turbine having a blade rotating within a shroud having a plurality of shroud segments, the method comprising:

obtaining a turbine parameter, wherein obtaining the turbine parameter includes receiving a sensed parameter and deriving an actual turbine parameter in response to said sensed parameter;

generating a tip clearance prediction in response to turbine cycle parameters;

generating at least one command signal in response to said turbine parameter and said tip clearance prediction;

providing said command signal to an actuator to adjust a position of at least one of said shroud segments.

12. The method of claim 11 wherein:

said at least one command signal includes a plurality of command signals, said providing including providing said command signals to a plurality of actuators to adjust a position of a plurality of said shroud segments.

13. The method of claim 11 wherein:

said generating said tip clearance prediction is preformed in real time.

14. The method of claim 11 further comprising:

updating a model used for generating said tip clearance prediction in response to environmental changes.

15. The method of claim 11 further comprising:

updating a model used for generating said tip clearance prediction in response to engine degradation.

16. A system for controlling blade tip clearance in a turbine, the system comprising:

a stator including a shroud having a plurality of shroud segments;

a rotor including a blade rotatable within said shroud;

an actuator assembly positioned radially around said shroud, said actuator assembly including a plurality of actuators;

a sensor for sensing a turbine parameter and generating a sensor signal representative of said turbine parameter;

a modeling module generating a tip clearance prediction in response to turbine cycle parameters;

a controller receiving said sensor signal and said tip clearance prediction and generating at least one command signal;

said actuators including at least one actuator receiving said command signal and adjusting a position of at least one of said shroud segments in response to said command signal, wherein said actuator includes an inflatable bellows in fluid communication with a pump, said command signal being applied to said pump to control pressure of said inflatable bellows.

* * * * *